US008247036B2

(12) United States Patent
Jiang et al.

(10) Patent No.: US 8,247,036 B2
(45) Date of Patent: *Aug. 21, 2012

(54) METHOD FOR MAKING COAXIAL CABLE

(75) Inventors: Kai-Li Jiang, Beijing (CN); Liang Liu, Beijing (CN); Kai Liu, Beijing (CN); Qing-Yu Zhao, Beijing (CN); Yong-Chao Zhai, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 838 days.

This patent is subject to a terminal disclaimer.

(21) Appl. No.: 12/321,573

(22) Filed: Jan. 22, 2009

(65) Prior Publication Data

US 2009/0196982 A1 Aug. 6, 2009

(30) Foreign Application Priority Data

Feb. 1, 2008 (CN) .......................... 2008 1 0066044

(51) Int. Cl.
*B05D 3/02* (2006.01)
*C23C 14/22* (2006.01)

(52) U.S. Cl. .................. 427/384; 427/434.6; 427/443.2; 427/250; 427/255.31; 427/255.7; 427/177; 204/192.1

(58) Field of Classification Search .................. 427/250, 427/255.7, 177, 384, 434.6, 443.2, 255.31; 117/84; 204/192.1
See application file for complete search history.

(56) References Cited

U.S. PATENT DOCUMENTS

| | | | | |
|---|---|---|---|---|
| 4,132,828 | A | 1/1979 | Nakamura et al. | |
| 4,461,923 | A | 7/1984 | Bogese, II | |
| 7,390,963 | B2 | 6/2008 | Scherer | |
| 7,413,474 | B2 | 8/2008 | Liu et al. | |
| 7,704,480 | B2 | 4/2010 | Jiang et al. | |
| 7,750,240 | B2 | 7/2010 | Jiang et al. | |
| 2002/0048632 | A1 * | 4/2002 | Smalley et al. | 427/230 |
| 2004/0020681 | A1 | 2/2004 | Hjortstam et al. | |
| 2004/0051432 | A1 | 3/2004 | Jiang et al. | |

(Continued)

FOREIGN PATENT DOCUMENTS

CN 1483667 3/2004

(Continued)

OTHER PUBLICATIONS

Herrmann, C.F., et al., "Multilayer and functional coatings on carbon nanotubes using atomic layer deposition". Applied Physics Letters 87, 123110 (2005), pp. 1-3.*

(Continued)

*Primary Examiner* — Bret Chen
(74) *Attorney, Agent, or Firm* — Altis Law Group, Inc.

(57) ABSTRACT

A method for making a coaxial cable, the method comprises the steps of: providing a carbon nanotube structure; and forming at least one conductive coating on a plurality of carbon nanotubes of the carbon nanotube structure; a carbon nanotube wire-like structure from the carbon nanotubes with at least one conductive coating; at least one layer of insulating material on the carbon nanotube wire-like structure; at least one layer of shielding material on the at least one layer of insulating material; and one layer of sheathing material on the at least one layer of shielding material.

18 Claims, 11 Drawing Sheets

U.S. PATENT DOCUMENTS

| | | | | |
|---|---|---|---|---|
| 2004/0053780 | A1 | 3/2004 | Jiang et al. | |
| 2004/0058153 | A1 * | 3/2004 | Ren et al. | 428/408 |
| 2004/0071949 | A1 * | 4/2004 | Glatkowski et al. | 428/313.3 |
| 2005/0208304 | A1 * | 9/2005 | Collier et al. | 428/403 |
| 2007/0075619 | A1 | 4/2007 | Jiang et al. | |
| 2007/0151744 | A1 | 7/2007 | Chen | |
| 2007/0166223 | A1 | 7/2007 | Jiang et al. | |
| 2007/0284987 | A1 | 12/2007 | Liu et al. | |
| 2007/0293086 | A1 * | 12/2007 | Liu et al. | 439/578 |
| 2008/0095694 | A1 | 4/2008 | Nakayama et al. | |
| 2008/0170982 | A1 * | 7/2008 | Zhang et al. | 423/447.3 |
| 2009/0196981 | A1 * | 8/2009 | Liu et al. | 427/113 |
| 2009/0196985 | A1 * | 8/2009 | Jiang et al. | 427/118 |
| 2009/0208742 | A1 | 8/2009 | Zhu et al. | |

FOREIGN PATENT DOCUMENTS

| | | | |
|---|---|---|---|
| CN | 1484275 | | 3/2004 |
| CN | 1982209 | | 6/2007 |
| CN | 1992099 | | 7/2007 |
| CN | 101003909 | | 7/2007 |
| CN | 101090011 | A | 12/2007 |
| JP | 7-169340 | * | 7/1995 |
| JP | 2004-342494 | | 12/2004 |
| JP | 2005-302309 | | 10/2005 |
| JP | 2007-536434 | | 12/2007 |
| TW | 200713384 | | 4/2007 |
| TW | 200724486 | | 7/2007 |
| TW | 200800798 | | 1/2008 |
| TW | 200802414 | | 1/2008 |
| TW | 200939252 | | 9/2009 |
| WO | WO2005007926 | | 1/2005 |
| WO | WO2005102924 | | 11/2005 |

OTHER PUBLICATIONS

Y.Zhang et al.Metal coating on suspended carbon nanotubes and its implication to metal-tube interaction, Chemical Physics Letters,Nov. 24, 2000,35-41,331,Elsevier Science.

Li Xia et al.“Electroless Plating of Carbon Nanotube with Gold” Journal of Materials Science & Engineering, vol. 22 (2004);pp. 48-51.

Li et al., Electroless Plating of Carbon Nanotube with Gold, Journal of Materials Science & Engineering, vol. 22, No. 1, pp. 48-51, Feb. 2004. Passage 2 of Left Column of p. 48 and Paragraph 3.2 of pp. 49-50 may be relevant.

* cited by examiner

METHOD FOR MAKING COAXIAL CABLE

RELATED APPLICATIONS

This application is related to commonly-assigned application entitled, "COAXIAL CABLE", U.S. patent application Ser. No. 12/321,572, filed Jan. 22, 2009; "COAXIAL CABLE", U.S. patent application Ser. No. 12/321,569, filed Jan. 22, 2009; "CARBON NANUTUBE WIRE-LIKE STRUCTURE", U.S. patent application Ser. No. 12/321,568, filed Jan. 22, 2009; "METHOD FOR MAKING CARBON NANUTUBE TWISTED WIRE", U.S. patent application Ser. No. 12/321,551, filed Jan. 22, 2009; "CARBON NANUTUBE COMPOSITE FILM", U.S. patent application Ser. No. 12/321,557, filed Jan. 22, 2009; "METHOD FOR MAKING CARBON NANOTUBE FILM", U.S. patent application Ser. No. 12/321,570, filed Jan. 22, 2009. The disclosures of the above-identified applications are incorporated herein by reference.

BACKGROUND

1. Technical Field

The present invention relates to methods for making coaxial cables and, particularly, to a method for making a carbon nanotube based coaxial cable.

2. Discussion of Related Art

Coaxial cables are used as carriers to transfer electrical power and signals. A conventional coaxial cable includes a core, an insulating layer, and a shielding layer, usually surrounded by a sheathing layer. The core includes at least one conducting wire. The conducting wire can be, e.g., a solid or braided wire, and the shielding layer can, for example, be a wound foil, a woven tape, or a braid. However, as for the conducting wire made of a metal, a skin effect will occur in the conducting wire. The skin effect can make the effective cross-section of the current flows reduce, thus the effective resistance of the cable becomes larger, and cause signal decay in the process of transmission. Further, the conducting wire and the shielding layer made of metal has less strength for its size, so must be comparatively greater in weight and diameter. Thus, the coaxial cables have problems being used in the fields, such as ultra-fine cable, space, or space equipment.

Conventional method for making the cable includes the following steps of: coating a polymer on an outer surface of the at least one wire to form an insulating layer; applying a plurality of metal wire or braided metal wire on the insulating layer to form a shielding layer; and covering a sheathing layer on the shielding layer.

Carbon nanotubes (CNTs) are a novel carbonaceous material and received a great deal of interest since the early 1990s. Carbon nanotubes have interesting and potentially useful heat conducting, electrical conducting, and mechanical properties. A conducting wire made by a mixture of carbon nanotubes and metal has been developed. However, the carbon nanotubes in the conducting wire are disorderly. Thus, the skin effect is not eliminated. Further, the method for making the coaxial cable having carbon nanotubes is executed by mixing a small amount of carbon nanotubes with a metal by means of vacuum melting, vacuum sintering or vacuum hot pressing. The method is complicated.

What is needed, therefore, is a method for making a coaxial cable, the method is simple, low-cost and suitable for mass production, and the coaxial cable has good conductivity, high mechanical performance, light quality and small diameter.

BRIEF DESCRIPTION OF THE DRAWINGS

Many aspects of the present coaxial cable and method for making the same can be better understood with references to the accompanying drawings. The components in the drawings are not necessarily drawn to scale, the emphasis instead being placed upon clearly illustrating the principles of the present coaxial cable and method for making the same.

Figure 1:
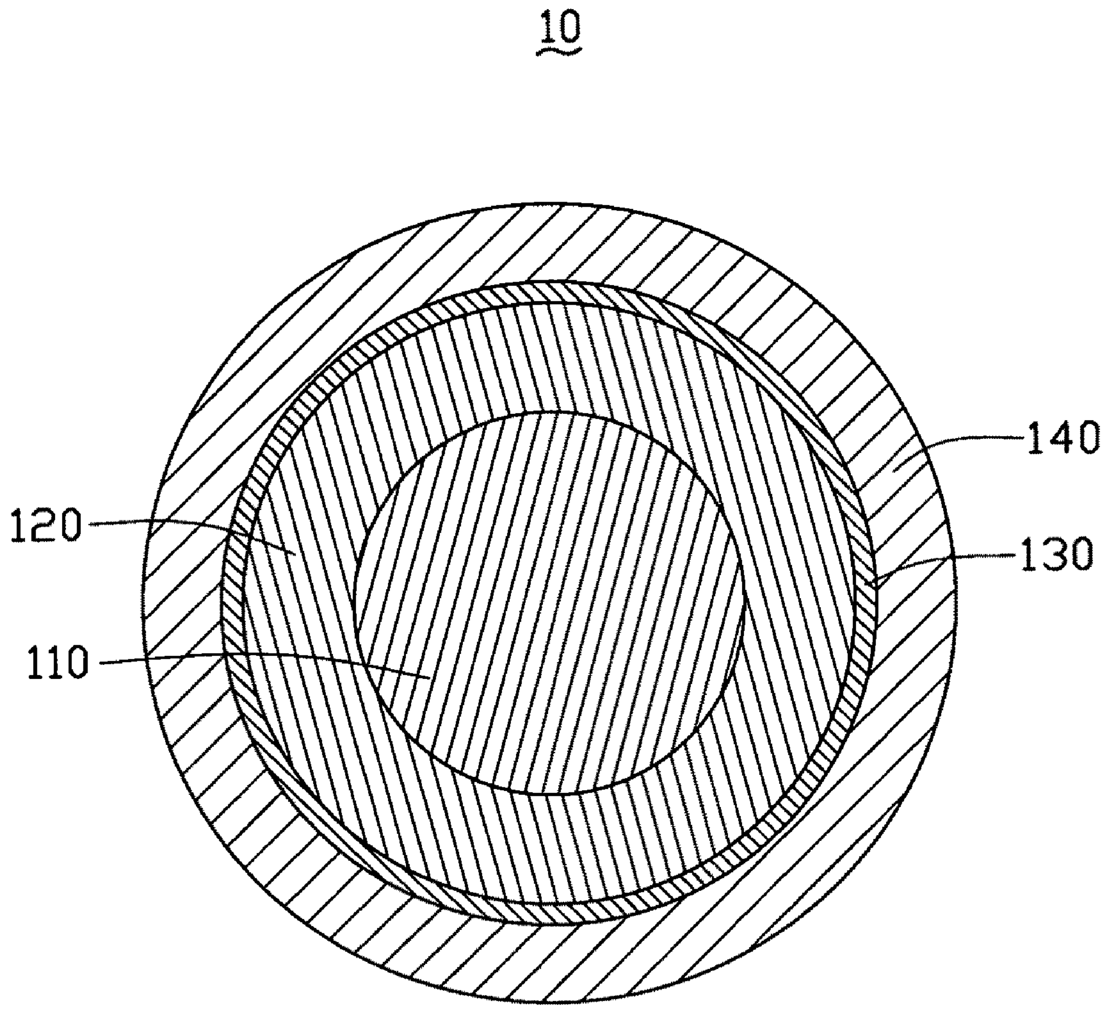
FIG. 1 is a schematic section view of a coaxial cable, in accordance with a first embodiment.

Corresponding reference characters indicate corresponding parts throughout the several views. The exemplifications set out herein illustrate at least one embodiment of the present coaxial cable and method for making the same, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present coaxial cable and method for making the same.

The coaxial cable includes at least one core, at least one insulating layer, at least one shielding layer, and a sheathing layer.

Referring to FIG. 1, a coaxial cable 10 according to a first embodiment includes a core 110, an insulating layer 120, a shielding layer 130, and a sheathing layer 140. The insulating layer 130 wraps the core 110. The shielding layer 130 wraps the insulating layer 120. The sheathing layer 140 wraps the shielding layer 130. The core 110, the insulating layer 120, the shielding layer 130, and the sheathing layer 140 are coaxial.

The core 110 includes at least one carbon nanotube wire-like structure. The wire-like structure means that the structure has a large ratio of length to diameter. Specifically, the core 110 includes a single carbon nanotube wire-like structure or a plurality of carbon nanotube wire-like structures. In the present embodiment, the core 110 includes one carbon nanotube wire-like structure. A diameter of the carbon nanotube wire-like structure can range from about 4.5 nanometers to about 1 millimeter or even larger. In one embodiment, a diameter of the carbon nanotube wire-like structure ranges from about 10 micrometers to about 30 micrometers.

The carbon nanotube wire-like structure includes a plurality of carbon nanotubes and at least one conductive coating covered on (e.g. surrounded) an outer surface of each of the carbon nanotubes. The carbon nanotubes are joined end-to-end by and combined by van der Waals attractive force between them. The carbon nanotube wire-like structure can be a twisted carbon nanotube wire with a plurality of carbon nanotubes arranged along a length axis of the carbon nanotube twisted wire. The carbon nanotube wire-like structure can be also an untwisted carbon nanotube wire, and the carbon nanotubes of the untwisted carbon nanotube wire are arranged along an axis of the carbon nanotube wire-like structure. A diameter of the carbon nanotube wire-like structure can range from about 4.5 nanometers to about 1 millimeter or even larger. In the present embodiment, the diameter of the carbon nanotube wire-like structure ranges from about 10 nanometers to about 30 micrometers.

Figure 2:
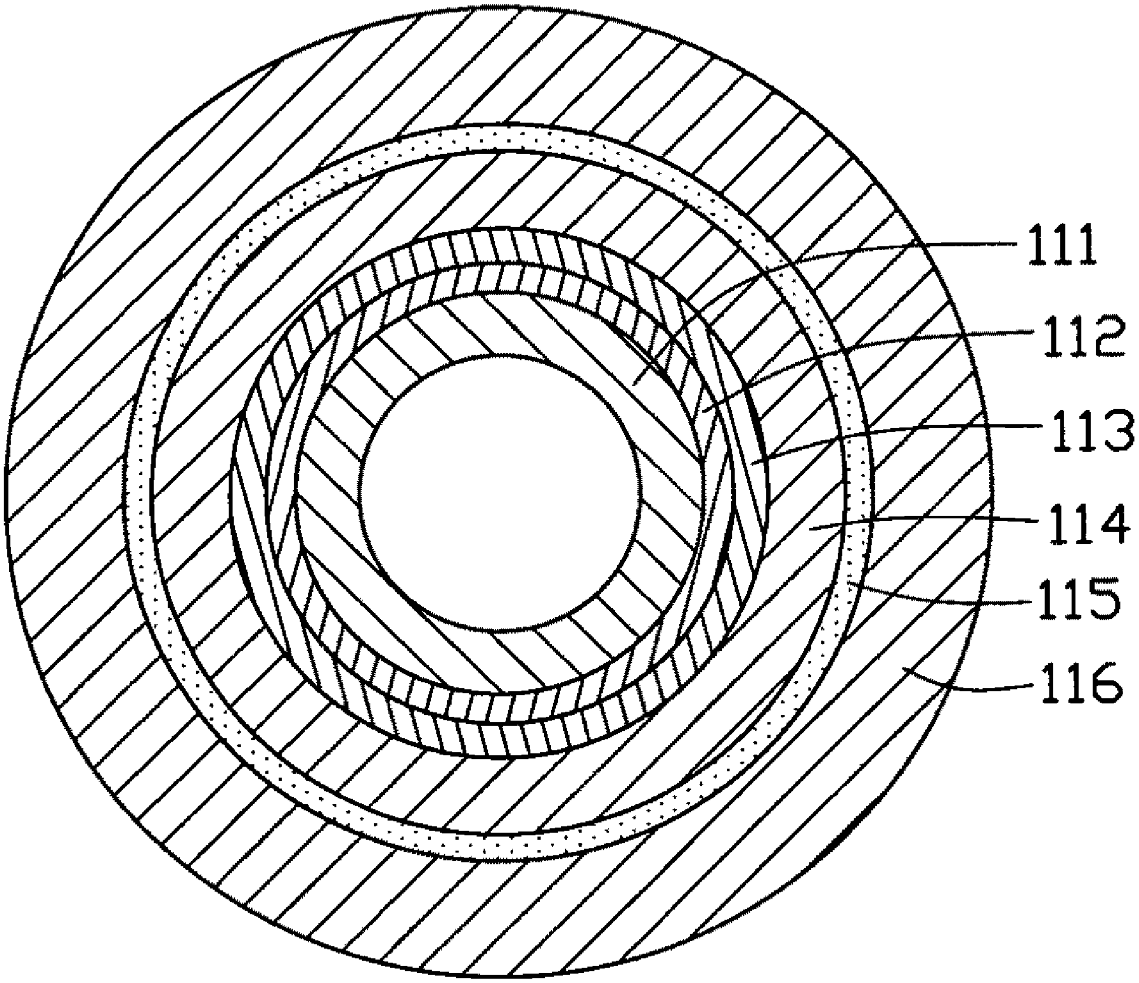
FIG. 2 is a schematic section view of an individual carbon nanotube of the cable, in accordance with a first embodiment.

Referring to FIG. 2, each carbon nanotube 111 in the carbon nanotube wire-like structure (not shown) is covered by at least one conductive coating on the outer surface thereof. More specifically, the at least one conductive coating further includes a wetting layer 112, a transition layer 113, a conductive layer 114, and an anti-oxidation layer 115. The wetting layer 112 is the most inner layer, covers the surface of the carbon nanotube 111, and combines directly with the carbon nanotube 111. The transition layer 113 covers and wraps the wetting layer 112. The conductive layer 114 covers and wraps the transition layer 113. The anti-oxidation layer 115 covers and wraps the conductive layer 114.

The carbon nanotube 111 cannot be adequately wetted by most metallic materials, thus, the wetting layer 112 is arranged for wetting the carbon nanotube 111, as well as combining the carbon nanotube 111 with the conductive layer 114. The material of the wetting layer 112 can be selected from a group consisting of iron (Fe), cobalt (Co), nickel (Ni), palladium (Pd), titanium (Ti), and any combination alloy thereof. A thickness of the wetting layer 112 ranges from about 1 nanometer to about 10 nanometers. In the present embodiment, the material of the wetting layer 112 is Ni and the thickness is about 2 nanometers. The wetting layer 112 is optional.

The transition layer 113 is arranged for combining the wetting layer 112 with the conductive layer 114. The material of the transition layer 113 can be combined with the material of the wetting layer 112 as well as the material of the conductive layer 114, such as copper (Cu), silver (Ag), or alloys thereof. A thickness of the transition layer 113 ranges from about 1 nanometer to about 10 nanometers. In the present embodiment, the material of the transition layer 113 is Cu and the thickness is about 2 nanometers. The transition layer 113 is optional.

The conductive layer 114 is arranged for enhancing the conductivity of the carbon nanotube twisted wire. The material of the conductive layer 114 can be selected from a conductive materials including Cu, Ag, gold (Au) and alloys thereof. A thickness of the conductive layer 114 ranges from about 1 nanometer to about 20 nanometers. In the present embodiment, the material of the conductive layer 114 is Ag and the thickness is about 10 nanometers.

The anti-oxidation layer 115 is arranged for preventing the oxidation of the carbon nanotube wire-like structure while producing the core 110. The oxidation of the carbon nanotube wire-like structure will reduce the conductivity thereof. The material of the anti-oxidation layer 115 can be Au, platinum (Pt), and any other anti-oxidation metallic materials or alloys thereof. A thickness of the anti-oxidation layer 115 ranges from about 1 nanometer to about 10 nanometers. In the present embodiment, the material of the anti-oxidation layer 115 is Pt and the thickness is about 2 nanometers. The anti-oxidation layer 115 is optional.

Furthermore, a strengthening layer 116 can be applied with the layer of conductive material to enhance the strength of the coaxial cable 10. The material of the strengthening layer 116 can be a polymer with high strength, such as polyvinyl acetate (PVA), polyvinyl chloride (PVC), polyethylene (PE), or prar-aphenylene benzobisoxazole (PBO). A thickness of the strengthening layer 116 ranges from about 0.1 microns to 1 micron. In the present embodiment, the strengthening layer 116 covers the anti-oxidation layer 115, the material of the strengthening layer 116 is PVA, and the thickness of the strengthening layer is about 0.5 microns. The strengthening layer 116 is optional.

The insulating layer 120 of the coaxial cable is used to insulate the core 110. A material of the insulating layer 120 can be selected from any appropriate material including polytetrafluoroethylene, polyethylene, polypropylene, polystyrene, polyethylene foam and nano-clay-polymer composite material. In the present embodiment, the material of the insulating layer 120 is polyethylene foam.

The shielding layer 130 is made of conductive material. The shielding layer 130 is used to shield electromagnetic signals or external signals. Specifically, the shielding layer 130 can be formed by woven wires or by winding films around the insulating layer 120. The wires can be metal wires, carbon nanotube wires or composite wires having carbon nanotubes. The films can be metal films, carbon nanotube films or a composite film having carbon nanotubes. The carbon nanotubes in the carbon nanotube film are arranged in an orderly manner or in a disorderly manner. A material of the metal wire or metal film can be selected from a group consisting of copper, gold or silver, and other good electrical conductivity of metal or their alloys. The carbon nanotube wire and carbon nanotube film include a plurality of carbon nanotubes oriented along a preferred direction, joined end to end, and combined by van der Waals attractive force. The composite can be composed of metal and carbon nanotubes or polymer and carbon nanotubes. The polymer can be selected from a group consisting of polyethylene Terephthalate (PET), polycarbonate (PC), acrylonitrile-Butadiene Styrene Terpolymer (ABS), polycarbonate/acrylonitrile-butadiene-styrene (PC/ABS) polymer materials, and other suitable polymer. When the shielding layer 130 is a composite film having carbon nanotubes, the shielding layer 130 can be formed by dispersing carbon nanotubes in a solution of the composite to form a mixture, and coating the mixture on the insulating layer. The shielding layer can comprise two or more layers formed by the wires or films or combination thereof.

The sheathing layer 140 is made of insulating material. In one embodiment, the sheathing layer 140 can be made of nano-clay-polymer composite materials. The nano-clay can be nano-kaolin clay or nano-montmorillonite. The polymer can be silicon resin, polyamide, polyolefin, such as polyethylene or polypropylene. In the present embodiment, the sheathing layer 140 is made of nano-clay-polymer composite materials. The nano-clay-polymer composite material has good mechanical property, fire-resistant property, and can provide protection against foreign injury, such as an effective machinery, chemical, physical, and other foreign injury.

Figure 3:
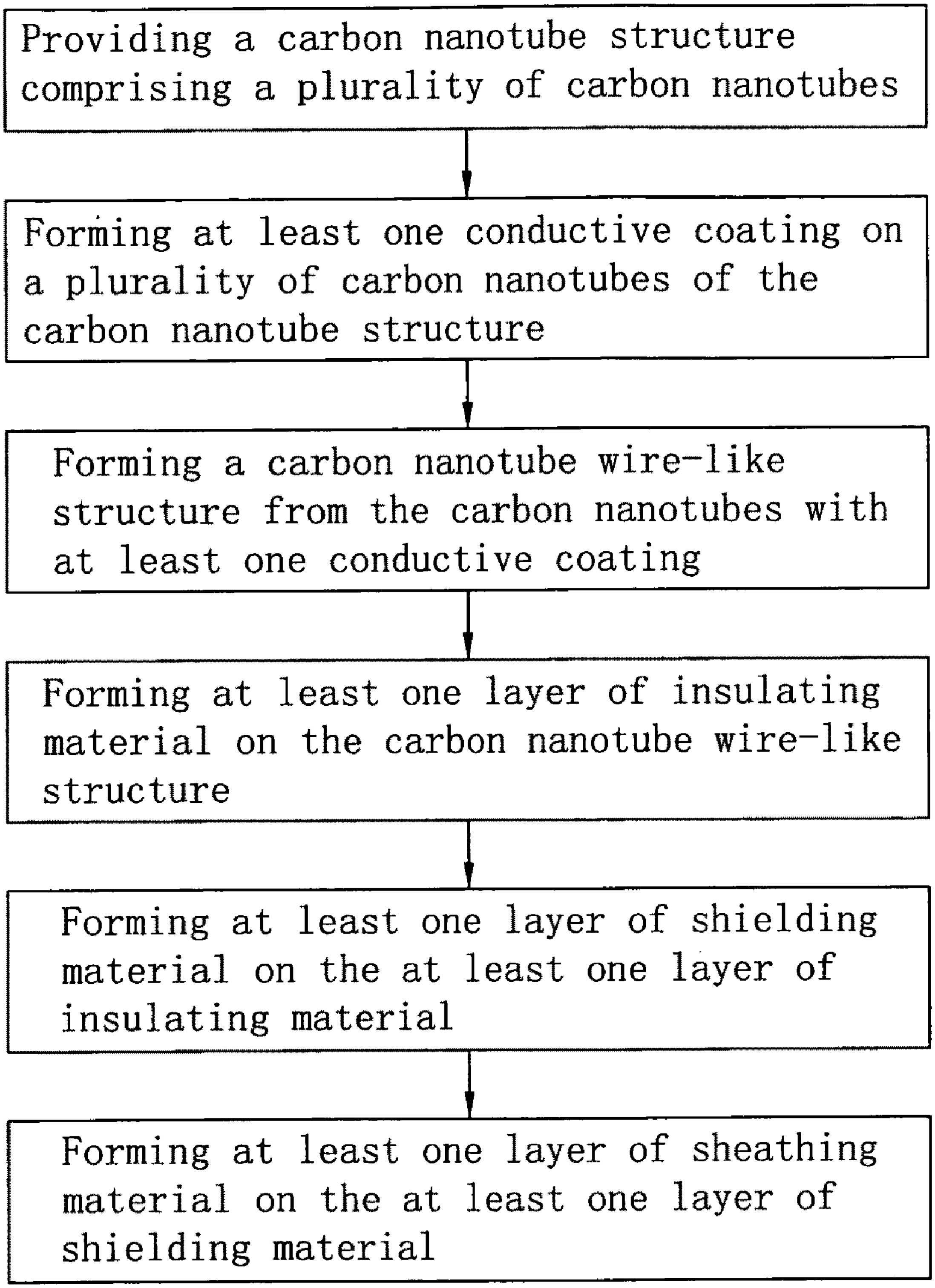
FIG. 3 is a flow chart of a method for making the coaxial cable.
Figure 4:
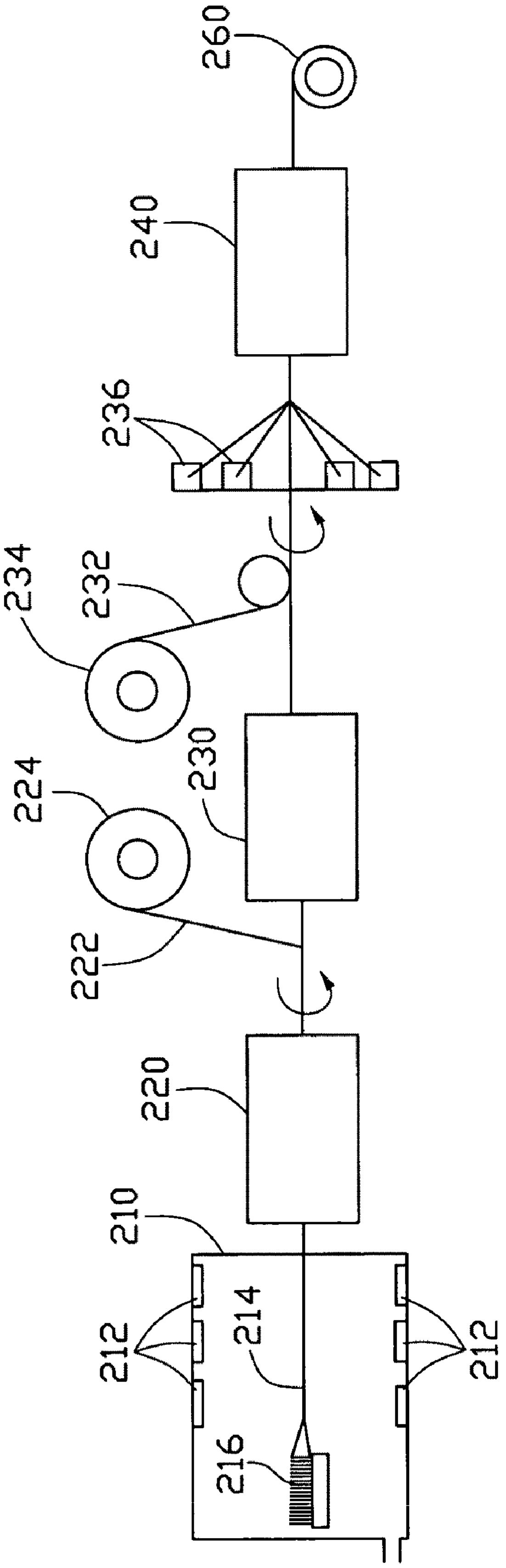
FIG. 4 is an apparatus for making the coaxial cable, in accordance with a first embodiment.

Referring to FIG. 3 and FIG. 4, a method for making the coaxial cable 10 includes the following steps: (a) providing a carbon nanotube structure 214 having a plurality of carbon nanotubes therein; and forming: (b) at least one conductive coating on each of the carbon nanotubes in the carbon nanotube structure 214; (c) a carbon nanotube wire-like structure 222; (d) at least one layer of insulating material on the carbon nanotube wire-like structure 222; (e) at least one layer of shielding material on the at least one layer of insulating material; and (f) one layer of sheathing material on the at least one layer of shielding material.

In step (a), the carbon nanotube structure 214 can be a carbon nanotube film. The carbon nanotube film includes a plurality of carbon nanotubes, and there are interspaces between adjacent two carbon nanotubes. Carbon nanotubes in the carbon nanotube film can parallel to a surface of the carbon nanotube film. A distance between adjacent two carbon nanotubes can be larger than a diameter of the carbon nanotubes. The carbon nanotube film can have a free-standing structure. The "free-standing" means that the carbon nanotube film does not have to be formed on a surface of a substrate to be supported by the substrate, but sustain the film-shape by itself due to the great van der Waals attractive force between the adjacent carbon nanotubes in the carbon nanotube film.

Step (a) can include the following steps of: (a1) providing a carbon nanotube array 216; (a2) pulling out a carbon nanotube film from the carbon nanotube array 216 by using a tool (e.g., adhesive tape, pliers, tweezers, or another tool allowing multiple carbon nanotubes to be gripped and pulled simultaneously).

In step (a1), a given carbon nanotube array 216 can be formed by the following substeps: (a11) providing a substantially flat and smooth substrate; (a12) forming a catalyst layer on the substrate; (a13) annealing the substrate with the catalyst layer in air at a temperature ranging from about 700° C. to about 900° C. for about 30 to 90 minutes; (a14) heating the substrate with the catalyst layer to a temperature ranging from about 500° C. to about 740° C. in a furnace with a protective gas therein; and (a15) supplying a carbon source gas to the furnace for about 5 to 30 minutes and growing the carbon nanotube array 216 on the substrate.

In step (a11), the substrate can be a P-type silicon wafer, an N-type silicon wafer, or a silicon wafer with a film of silicon dioxide thereon. In the present embodiment, a 4-inch P-type silicon wafer is used as the substrate.

In step (a12), the catalyst can be made of iron (Fe), cobalt (Co), nickel (Ni), or any alloy thereof.

In step (a14), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The carbon nanotube array 216 can be about 200 to about 400 microns in height and include a plurality of carbon nanotubes parallel to each other and approximately perpendicular to the substrate. The carbon nanotubes in the carbon nanotube array 216 can be single-walled carbon nanotubes, double-walled carbon nanotubes, or multi-walled carbon nanotubes. Diameters of the single-walled carbon nanotubes range from about 0.5 nanometers to about 10 nanometers. Diameters of the double-walled carbon nanotubes range from about 1 nanometer to about 50 nanometers. Diameters of the multi-walled carbon nanotubes range from about 1.5 nanometers to about 50 nanometers.

The carbon nanotube array 216 formed under the above conditions is essentially free of impurities such as carbonaceous or residual catalyst particles. The carbon nanotubes in the carbon nanotube array 216 are closely packed together by van der Waals attractive force.

In step (a2), the carbon nanotube film can be formed by the following substeps: (a21) selecting one or more carbon nanotubes having a predetermined width from the array of carbon nanotubes; and (a22) pulling the carbon nanotubes to form carbon nanotube segments that are joined end to end at an uniform speed to achieve a uniform carbon nanotube film.

In step (a21), the carbon nanotube segments can be selected by using an adhesive tape such as the tool to contact the carbon nanotube array 216. Each carbon nanotube segment includes a plurality of carbon nanotubes parallel to each other.

Figure 5:
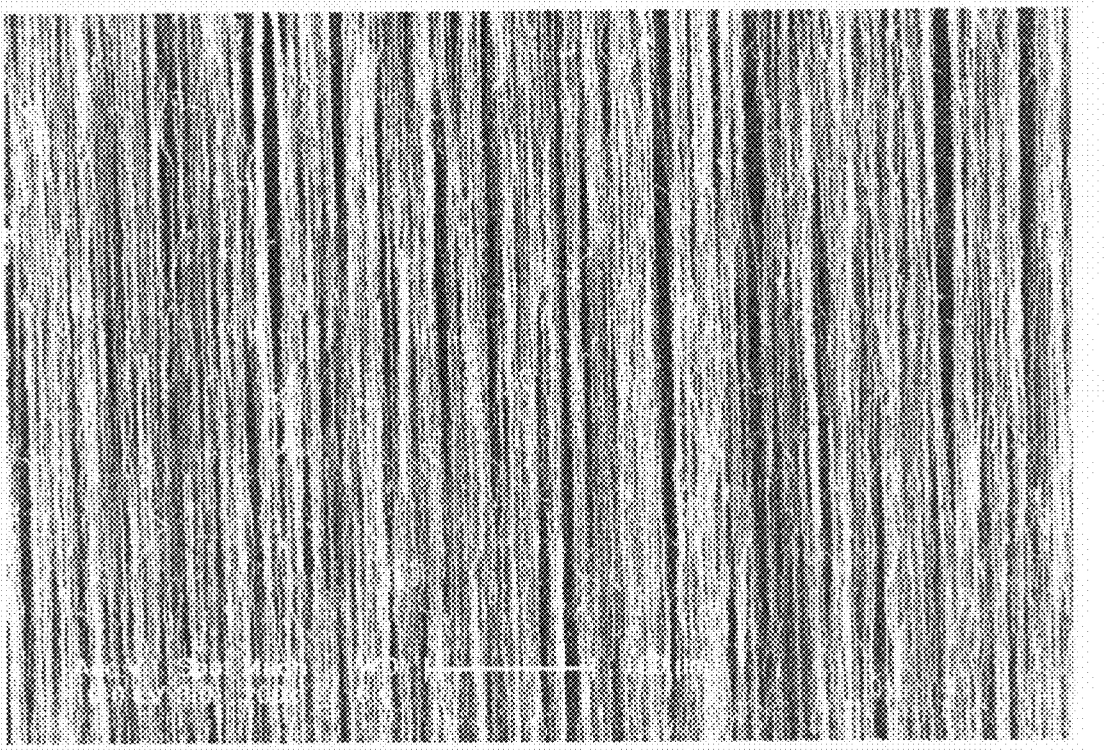
FIG. 5 shows a Scanning Electron Microscope (SEM) image of a carbon nanotube film used in the method for making the coaxial cable, in accordance with a first embodiment.

More specifically, during the pulling process, as the initial carbon nanotube segments are drawn out, other carbon nanotube segments are also drawn out end-to-end due to the van der Waals attractive force between ends of adjacent segments. This process of drawing ensures that a continuous, uniform carbon nanotube film having a predetermined width can be formed. Referring to FIG. 5, the carbon nanotube film (also known as a yarn, a ribbon, a yarn string among other terms used to define the structure) includes a plurality of carbon nanotubes joined end-to-end. The carbon nanotubes in the carbon nanotube film 214 are all substantially parallel to the pulling/drawing direction of the carbon nanotube film, and the carbon nanotube film produced in such manner can be selectively formed to have a predetermined width. The carbon nanotube film formed by the pulling/drawing method has superior uniformity of thickness and superior uniformity of conductivity over a typically disordered carbon nanotube film. Furthermore, the pulling/drawing method is simple, fast, and suitable for industrial applications.

The width of the carbon nanotube film depends on a size of the carbon nanotube array 216. The length of the carbon nanotube film can be arbitrarily set as desired. When the substrate is a 4-inch P-type silicon wafer, as in the present embodiment, the width of the carbon nanotube film ranges from about 0.01 centimeters to about 10 centimeters, the length of the carbon nanotube film can be above 100 meters, and the thickness of the carbon nanotube film ranges from about 0.5 nanometers to about 100 microns.

In step (b), the at least one conductive coating can be formed on the carbon nanotube structure 214 by a physical vapor deposition (PVD) method such as a vacuum evaporation or a sputtering. In the present embodiment, the at least one conductive coating is formed by a vacuum evaporation method.

The vacuum evaporation method for forming the at least one conductive coating of step (b) can further include the following substeps: (b1) providing a vacuum container 210 including at least one vaporizing source 212; and (b2) heating the at least one vaporizing source 212 to deposit the layer of conductive material on each of the carbon nanotubes in the carbon nanotube structure 214.

In step (b1), the vacuum container 210 includes a depositing zone therein. At least one pair of vaporizing sources 212 includes an upper vaporizing source 212 located on a top surface of the depositing zone, and a lower vaporizing source 212 located on a bottom surface of the depositing zone. The two vaporizing sources 212 are on opposite sides of the vacuum container 210. Each pair of vaporizing sources 212 includes a type of metallic material. The materials in different pairs of vaporizing sources 212 can be arranged in the order of conductive materials orderly formed on the carbon nanotube film. The pairs of vaporizing sources 212 can be arranged along a pulling direction of the carbon nanotube structure 214 on the top and bottom surface of the depositing zone. The carbon nanotube structure 214 is located in the vacuum container 210 and between the upper vaporizing source 212 and the lower vaporizing source 212. There is a distance between the carbon nanotube structure 214 and the vaporizing sources 212. An upper surface of the carbon nanotube structure 214 faces the upper vaporizing sources 212. A lower surface of the carbon nanotube structure 214 faces the lower vaporizing sources 212. The vacuum container 210 can be evacuated by use of a vacuum pump (not shown).

Figure 6:
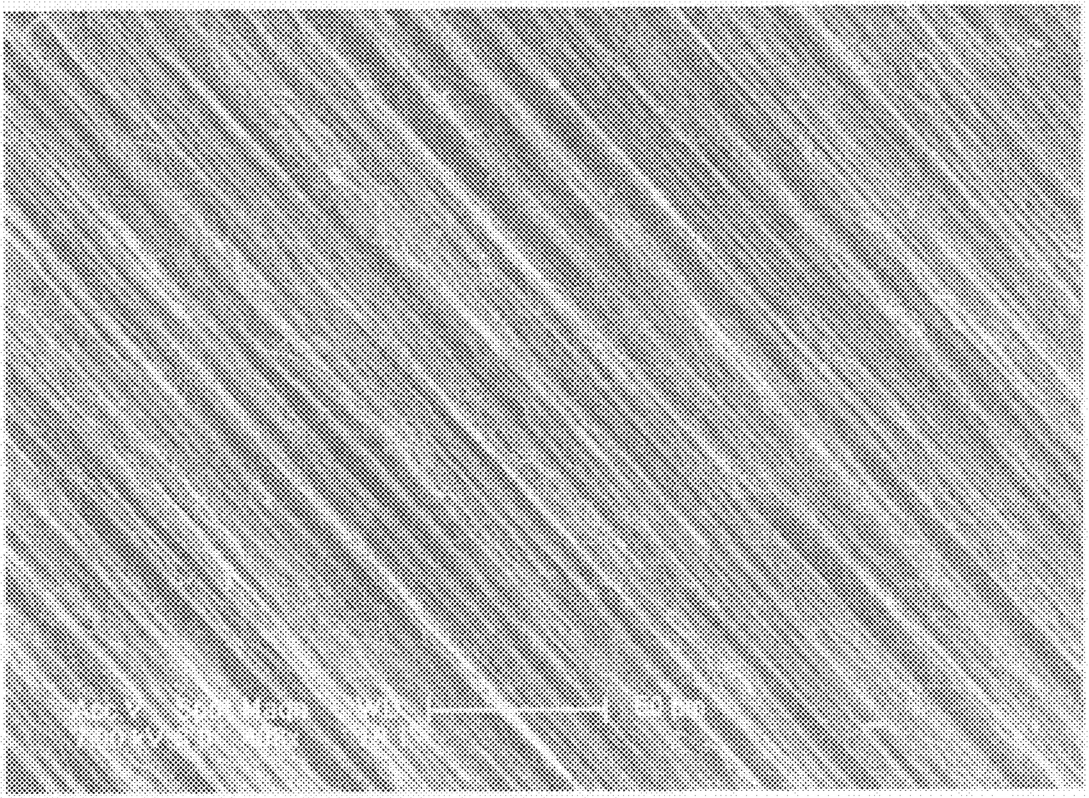
FIG. 6 shows a Scanning Electron Microscope (SEM) image of a carbon nanotube film with at least one conductive coating thereon used in the method for making the coaxial cable, in accordance with a first embodiment.
Figure 7:
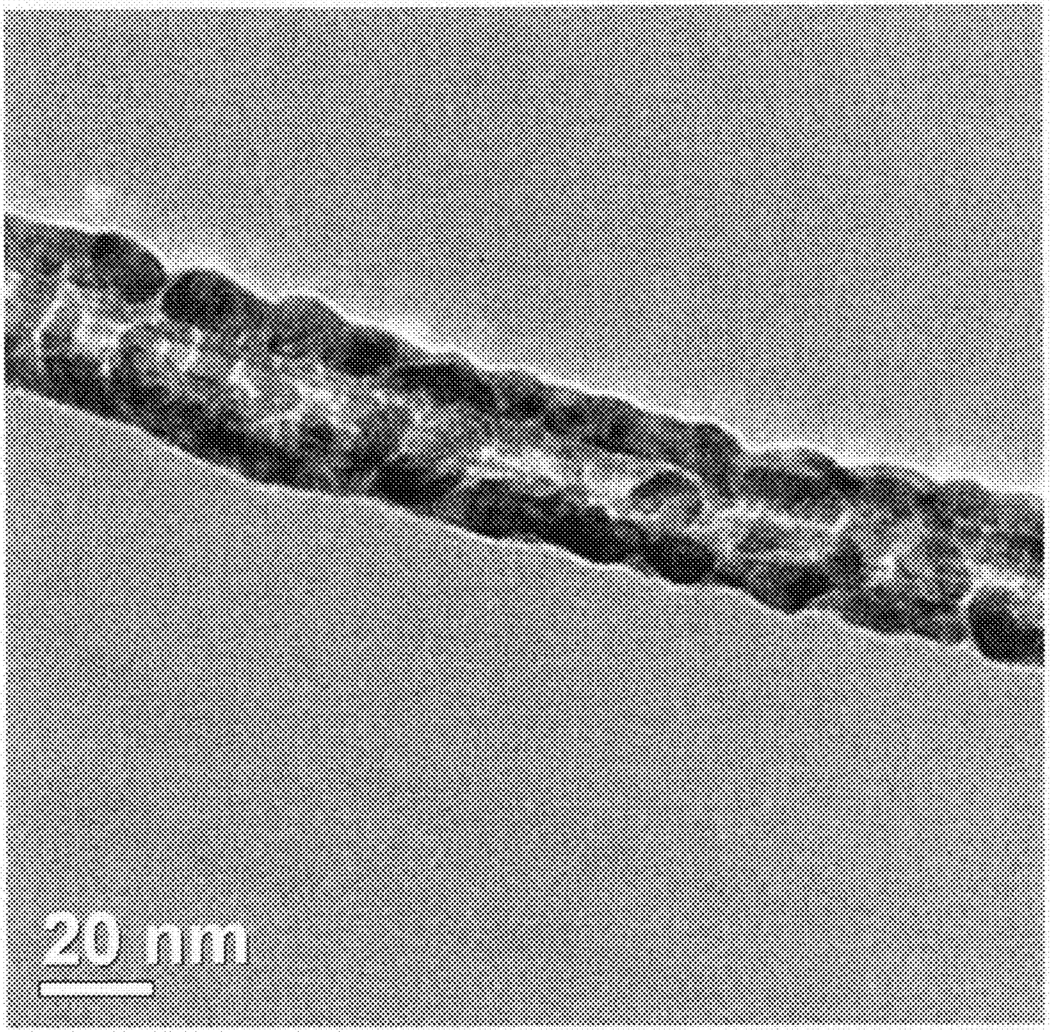
FIG. 7 shows a Transmission Electron Microscope (TEM) image of a carbon nanotube in the carbon nanotube film with at least one conductive coating thereon, in accordance with a first embodiment.

In step (b2), the vaporizing source 212 can be heated by a heating device (not shown). The material in the vaporizing source 212 is vaporized or sublimed to form a gas. The gas meets the cold carbon nanotube structure 214 and coagulates on the upper surface and the lower surface of the carbon nanotube structure 214. Due to a plurality interspaces existing between the carbon nanotubes in the carbon nanotube structure 214, in addition to the carbon nanotube structure 214 being relatively thin, the conductive material can be infiltrated in the interspaces in the carbon nanotube structure 214 between the carbon nanotubes. As such, the conductive material can be deposited on the outer surface of most, if not all, of the single carbon nanotubes. A microstructure of the carbon nanotube structure 214 with at least one conductive material is shown in FIG. 6 and FIG. 7.

It is to be understood that a depositing area of each vaporizing source 212 can be adjusted by varying the distance between two adjacent vaporizing sources 212 or the distance between the carbon nanotube film and the vaporizing source 212. Several vaporizing sources 212 can be heated simultaneously, while the carbon nanotube structure 214 is pulled through the depositing zone between the vaporizing sources 212 to form a layer of conductive material.

To increase a density of the gas in the depositing zone, and prevent oxidation of the conductive material, the vacuum degree in the vacuum container 210 is above 1 pascal (Pa). In the present embodiment, the vacuum degree is about $4\times10^{-4}$ Pa.

It is to be understood that the carbon nanotube array 216, like the one formed in step (a1) can be directly placed in the vacuum container 210. The carbon nanotube film 214 can be pulled in the vacuum container 210 and successively pass each vaporizing source 212, with each layer of conductive material continuously depositing. Thus, the pulling step and the depositing step can be processed simultaneously.

In the present embodiment, the method for forming the at least one conductive coating includes the following steps: forming a wetting layer on a surface of the carbon nanotube structure 214; forming a transition layer on the wetting layer; forming a conductive layer on the transition layer; and forming an anti-oxidation layer on the conductive layer. In the above-described method, the steps of forming the wetting layer, the transition layer, and the anti-oxidation layer are optional.

It is to be understood that the method for forming at least one conductive coating on each of the carbon nanotubes in the carbon nanotube structure 214 in step (b) can be a physical method such as vacuum evaporating or sputtering as described above, and can also be a chemical method such as electroplating or electroless plating. In the chemical method, the carbon nanotube structure 214 can be disposed in a chemical solution.

Step (b) further including forming a strengthening layer outside the at least one conductive coating. More specifically, the carbon nanotube structure 214 with the at least one conductive coating applied to the individual carbon nanotubes can be immersed in a container 220 with a liquid polymer. Thus, the entire surface of the carbon nanotube structure 214 can be soaked with the liquid polymer. After concentration (e.g., being cured), a strengthening layer can be formed on the outside of the carbon nanotube structure 214.

In step (c), when the carbon nanotube structure 214 is a carbon nanotube wire, the carbon nanotube structure 214 with at least one conductive coating thereon is a carbon nanotube wire-like structure 222.

When the carbon nanotube structure 214 is a carbon nanotube film. Step (c) with at least one conductive coating thereon can be treated with mechanical force (e.g., a conventional spinning process) to acquire a twisted carbon nanotube wire-like structure 222. The carbon nanotube structure 214 is twisted along an aligned direction of carbon nanotubes therein.

In the present embodiment, step (c) can be executed by three methods. The first method includes the following steps of: (c1) adhering one end of the carbon nanotube structure to a rotating motor; and twisting the carbon nanotube structure by the rotating motor. The second method includes the following steps of: (c1') supplying a spinning axis; (c2') contacting the spinning axis to one end of the carbon nanotube structure; and (c3') twisting the carbon nanotube structure by the spinning axis. The third method can be executed by cutting the carbon nanotube structure, with at least one conductive coating applied to the individual carbon nanotubes thereon, along the aligned direction of the carbon nanotubes.

A plurality of carbon nanotube wire-like structures 222 can be stacked or twisted to form one carbon nanotube wire-like structure with a larger diameter. A plurality of coated carbon nanotube structures 214 can be arranged parallel to each other and then twisted to form the carbon nanotube wire-like structure with the large diameter. Also, two or more coated carbon nanotube structures 214 can be stacked and then twisted to form the carbon nanotube wire-like structure with the large diameter. In one embodiment, about 500 layers of carbon nanotube films are stacked with each other and twisted to form a carbon nanotube wire-like structure 222 whose diameter can reach up to 3 millimeters.

The conductivity of the carbon nanotube wire-like structure 222 is better than the conductivity of the carbon nanotube structure 214 without conductive coating on each carbon nanotube. The resistivity of the carbon nanotube wire-like structure 222 can be ranged from about $10\times10^{-8}$ Ω·m to about $500\times10^{-8}$ Ω·m. In the present embodiment, the carbon nanotube wire-like structure 222 has a diameter of about 120 microns, and a resistivity of about $360\times10^{-8}$ Ω·m. The resistivity of the carbon nanotube structure 214 without conductive coating is about $1\times10^{-5}$ Ω·m~$2\times10^{-5}$ Ω·m.

Figure 8:
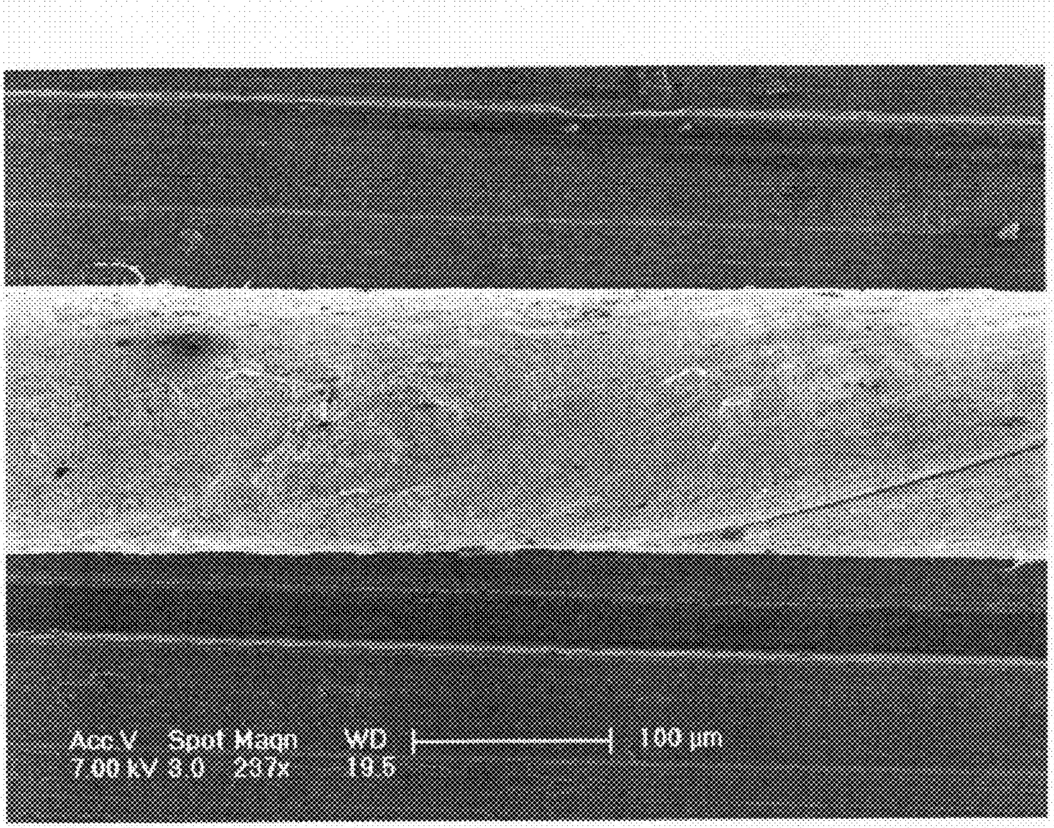
FIG. 8 shows a Scanning Electron Microscope (SEM) image of a twisted carbon nanotube wire-like structure, in accordance with a first embodiment.
Figure 9:
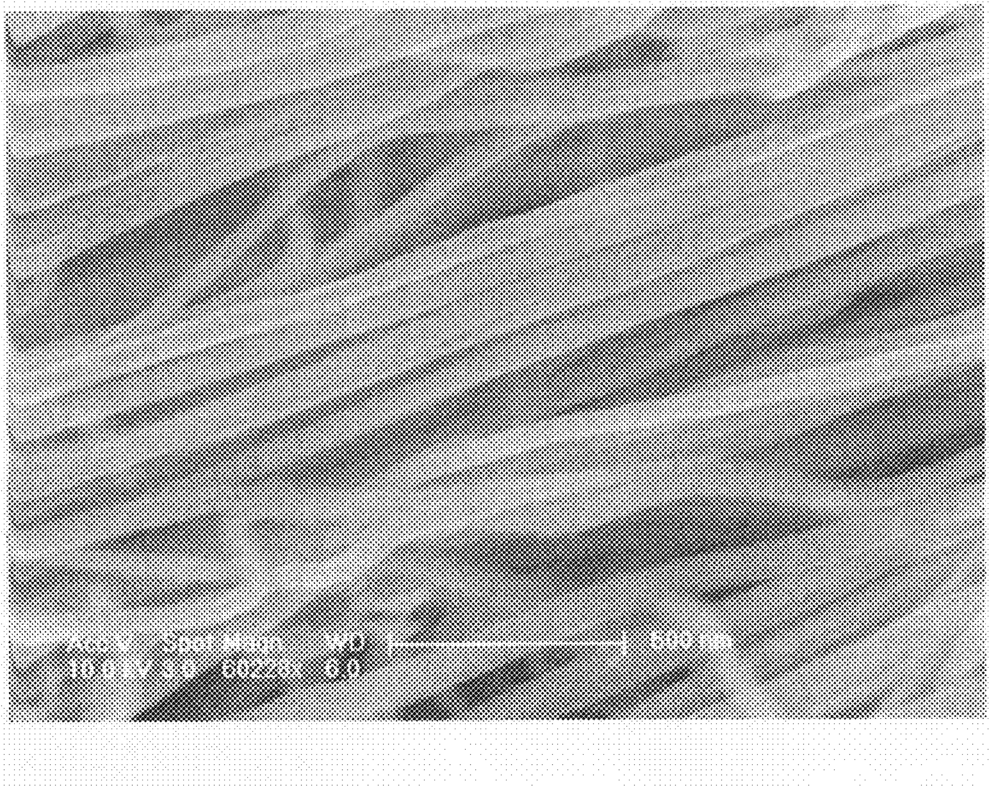
FIG. 9 shows a Scanning Electron Microscope (SEM) image of the carbon nanotubes with at least one layer of conductive coating individually coated thereon in the twisted carbon nanotube wire-like structure of FIG. 8.

An SEM image of a carbon nanotube wire-like structure 222 can be seen in FIGS. 8 and 9. The carbon nanotube wire-like structure 222 includes a plurality of carbon nanotubes with at least one conductive material and twisted along an axis of the carbon nanotube wire-like structure 222.

Optionally, the steps of forming the carbon nanotube structure 214, the at least one conductive coating, and the strengthening layer can be processed in a same vacuum container to achieve a continuous production of the carbon nanotube wire-like structure 222. The acquired carbon nanotube wire-like structure 222 can be further collected by a first roller 224 by coiling the carbon nanotube wire-like structure 222 onto a first roller 224.

Step (d) can be executed by a first heated pressure device 230. The melting polymer is coated on an outer surface of the carbon nanotube wire-like structure 222 by a first heated pressure device 230. After concentration (e.g., being cured), a layer of insulating material is formed on the carbon nanotube wire-like structure 222. In the present embodiment, the polymer is polyethylene foam component. When the coaxial cable includes two or more layers of insulating material, step (d) can be repeated.

In step (e), a layer of shielding material can be formed by woven wires or by winding films around the at least one layer of insulating material 120. The shielding films 232 can be provided by a second roller 234. The wires can be metal wires or carbon nanotube wires. The films can be metal films, carbon nanotube films or composite films having carbon nanotubes. The wires can be winded on the at least one layer of insulating material 120 by a rack 236. The carbon nanotubes in the carbon nanotube film can be orderly and/or disorderly.

Step (f) can be executed by a second pressure device 240. The sheathing material is coated on an outer surface of the shielding layer 130 by a second pressure device 240. After concentration (e.g., being cured), a sheathing layer is formed. In the present embodiment, the sheathing material is nanoclay-polymer composite material. The acquired coaxial cable can be further collected by a third roller 260 by coiling the cable onto a third roller 260.

Figure 10:
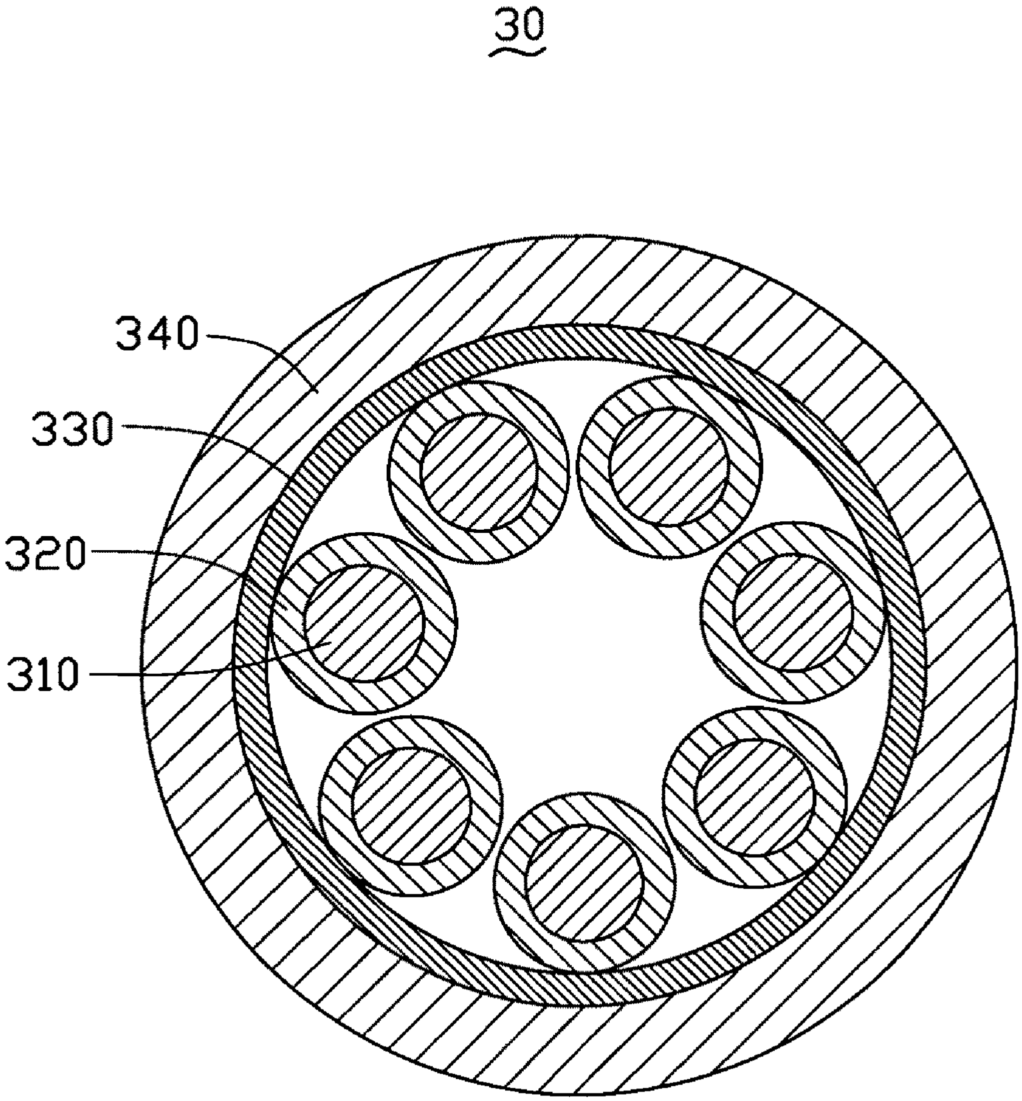
FIG. 10 shows a schematic section view of a coaxial cable, in accordance with a second embodiment.

Referring to FIG. 10, a cable 30 according to a second embodiment is a coaxial cable, and includes a plurality of cores 310, a plurality of insulating layers 320, a shielding layer 330, and a sheathing layer 340. Each insulating layer 320 wraps each core. The shielding layer 330 wraps the plurality of insulating layer 320. The sheathing layer 340 wraps the shielding layer 330. Between the shielding layer 330 and the insulating layer 320, insulating material is filled. The method for making the coaxial cable 30 of the second embodiment is similar to that of the coaxial cable 10 of the first embodiment. The plurality of cores with insulating layers can be twisted or non-twisted.

Figure 11:
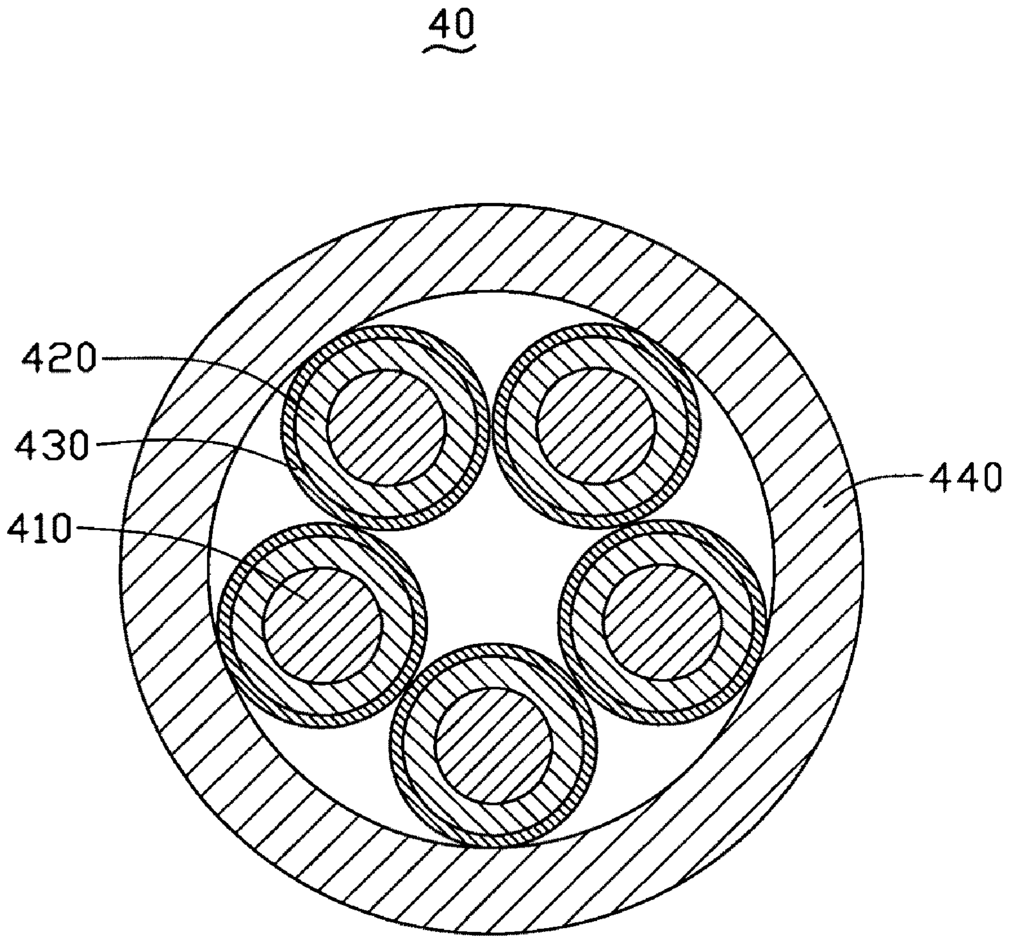
FIG. 11 shows a schematic section view of a coaxial cable, in accordance with a third embodiment.

Referring to FIG. 11, a coaxial cable 40 according to a third embodiment includes a plurality of cores 410, a plurality of insulating layer 420, a plurality of shielding layer 430, and a sheathing layer 440. The insulating layer 430 wraps each of the plurality of cores 410. The shielding layer 430 wraps each of the insulating layer 420. The sheathing layer 440 wraps all the shielding layers 430. The method for making the coaxial cable of the third embodiment is similar to that of the coaxial cable of the first embodiment. The plurality of cores with insulation and shielding layers can be twisted or non-twisted.

In this embodiment, the shielding layer 430 can shield each core respectively. This structure can avoid interference coming from outer factors, and can avoid interference between the plurality of cores.

The coaxial cable provided in the embodiments has at least the following superior properties. Firstly, the coaxial cable includes a plurality of oriented carbon nanotubes joined end-to-end by van der Waals attractive force. Thus, the coaxial cable has high strength and toughness. Secondly, the outer surface of each carbon nanotube is covered by at least one conductive coating. Thus, the at least one nano sized core has high conductivity. Thirdly, the method for making the core of the coaxial cable is performed by drawing a carbon nanotube structure from a CNT array and forming at least one conductive coating on the carbon nanotube structure. The method is simple and relatively inexpensive. Additionally, the coaxial cable can be formed continuously and, thus, a mass production thereof can be achieved. Fourthly, since the carbon nanotubes have a small diameter, and the coaxial cable includes a plurality of carbon nanotubes and at least one conductive coating thereon, thus the coaxial cable has a smaller width than a metal wire formed by a conventional wire-drawing method and can be used in ultra-fine (thin) coaxial cables. Finally, since the carbon nanotubes are hollow, and a thickness of the at least one layer of the conductive material is just several nanometers, thus a skin effect would not occur in the coaxial cable, and signals will not decay in the process of transmission.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that the above description and the claims drawn to a method may include some indication in reference to certain steps. However, the indication used is only to be viewed for identification purposes and not as a suggestion as to an order for the steps.

What is claimed is:

1. A method for making a coaxial cable, the method comprising the steps of:

(a) providing a carbon nanotube structure comprising a plurality of carbon nanotubes; and forming:

(b) at least one conductive coating on the plurality of carbon nanotubes of the carbon nanotube structure, and a strengthening layer surrounding the at least one conductive coating by immersing the carbon nanotube structure with the at least one conductive coating applied to the plurality of carbon nanotubes in a container of liquid polymer, such that the entire surface of the plurality of carbon nanotubes of the carbon nanotube structure are soaked with the liquid polymer, and curing the liquid polymer;

(c) a carbon nanotube wire structure from the carbon nanotubes with the at least one conductive coating and the strengthening layer;

(d) at least one layer of insulating material on the carbon nanotube wire structure;

(e) at least one layer of shielding material on the at least one layer of insulating material; and (f) at least one layer of sheathing material on the at least one layer of shielding material.

2. The method as claimed in claim 1, wherein the plurality of carbon nanotubes is parallel to a surface of the carbon nanotube structure.

3. The method as claimed in claim 2, wherein the carbon nanotube structure comprises a carbon nanotube film.

4. The method as claimed in claim 3, wherein the carbon nanotube film comprises a plurality of successively oriented carbon nanotube segments joined end-to-end by van der Waals attractive force therebetween, and each carbon nanotube segment comprises a plurality of the carbon nanotubes parallel to each other, and combined by van der Waals attractive force therebetween.

5. The method as claimed in claim 2, wherein in step (c), carbon nanotube structure is twisted about an aligned direction of the plurality of carbon nanotubes therein.

6. The method as claimed in claim 2, wherein in step (c), the carbon nanotube wire structure is acquired by cutting the carbon nanotube structure parallel to an alignment direction of the plurality of carbon nanotubes.

7. The method as claimed in claim 1, wherein the plurality of carbon nanotubes of the carbon nanotube structure is substantially aligned along a same direction.

8. The method as claimed in claim 1, wherein in step (b), the at least one conductive coating is formed on the plurality of carbon nanotubes of the carbon nanotube structure by means of physical vapor deposition.

9. The method as claimed in claim 8, wherein the conductive coating is formed by means of vacuum evaporation or sputtering.

10. The method as claimed in claim 9, wherein step (b) is executed by the following steps of:

(b1) providing a vacuum container with at least one conductive material vaporizing source; and (b2) heating the at least one conductive material vaporizing source to deposit a conductive coating on each of the plurality of carbon nanotubes of the carbon nanotube structure.

11. The method as claimed in claim 10, wherein in step (b2), the conductive coating is formed on an outer surface of each of the plurality of carbon nanotubes of the carbon nanotube structure, a material of the conductive layer comprises of a material selected from the group consisting of gold, silver, copper and any alloy thereof; and the thickness of the conductive layer ranges from about 1 nanometer to about 20 nanometers.

12. The method as claimed in claim 11, wherein step (b) further comprises forming a wetting layer on the plurality of carbon nanotubes of the carbon nanotube structure, and forming a transition layer on the wetting layer before the conductive layer.

13. The method as claimed in claim 11, wherein in step (b), an anti-oxidation layer is formed on the conductive layer.

14. The method as claimed in claim 1, wherein in step (c), the carbon nanotube wire structure is acquired by treating the carbon nanotube structure with a mechanical force.

15. The method as claimed in claim 14, wherein step (c) further comprises the following steps of:

(c1) adhering one end of the carbon nanotube structure coated with the at least one conductive coating and the strengthening layer to a rotating motor; and (c2) twisting the carbon nanotube structure coated with the at least one conductive coating and the strengthening layer with the rotating motor.

16. The method as claimed in claim 14, wherein step (c) further comprises the following steps of:

(c1') supplying a spinning axis;

(c2') contacting the spinning axis to one end of the carbon nanotube structure coated with the at least one conductive coating and the strengthening layer; and (c3') twisting the carbon nanotube structure coated with the at least one conductive coating and the strengthening layer by the spinning axis.

17. The method as claimed in claim 1, wherein in step (e), the shielding layer has a wire or film structure, and a material of the shielding layer comprises of a material selected from the group consisting of carbon nanotubes, metals and composite having carbon nanotubes.

18. The method as claimed in claim 17, wherein step (e) further comprises applying a wire or woven wire on the insulating layer, or winding a film around the insulating layer.

* * * * *